United States Patent
Jungert

(10) Patent No.: US 7,688,115 B2
(45) Date of Patent: Mar. 30, 2010

(54) CMOS OUTPUT DRIVER

(75) Inventor: Horst Jungert, Buch am Erlbach (DE)

(73) Assignee: Texas Instruments Deutschland GmbH, Freising (DE)

( * ) Notice: Subject to any disclaimer, the term of this patent is extended or adjusted under 35 U.S.C. 154(b) by 2 days.

(21) Appl. No.: 11/849,655

(22) Filed: Sep. 4, 2007

(65) Prior Publication Data
US 2008/0054934 A1 Mar. 6, 2008

(30) Foreign Application Priority Data
Sep. 4, 2006 (DE) .................. 10 2006 041 440

(51) Int. Cl.
*H03K 19/0175* (2006.01)
*H03K 19/094* (2006.01)
*H03K 19/082* (2006.01)
*H03H 7/38* (2006.01)

(52) U.S. Cl. ............. 326/88; 326/62; 326/63; 326/64; 326/82; 326/83; 326/84; 326/85; 326/86; 326/89; 326/92; 333/32

(58) Field of Classification Search .......... 326/62, 326/80–87
See application file for complete search history.

(56) References Cited

U.S. PATENT DOCUMENTS

| 4,987,324 | A * | 1/1991 | Wong et al. ............... 326/27 |
| 5,107,230 | A * | 4/1992 | King ........................ 326/86 |
| 6,483,354 | B1 * | 11/2002 | Gasparik .................. 327/112 |
| 6,646,470 | B2 * | 11/2003 | Fulkerson ................. 326/83 |
| 2005/0280435 | A1 | 12/2005 | Srivastava et al. |

FOREIGN PATENT DOCUMENTS

| DE | 2929450 | 3/1980 |
| DE | 10255642 | 6/2004 |

* cited by examiner

*Primary Examiner*—Vibol Tan
*Assistant Examiner*—Matthew C Tabler
(74) *Attorney, Agent, or Firm*—John J. Patti; Wade J. Brady, III; Frederick J. Telecky, Jr.

(57) ABSTRACT

A CMOS output driver is provided for driving a capacitive load over a circuit trace in high speed applications. The CMOS output driver comprises a signal input and a signal output. The output driver has a first buffer amplifier with an input connected to the signal input and an output connected to the signal output through a resistor. A second buffer amplifier is also provided, which has an input connected to the signal input and an output connected to the signal output through a capacitor.

6 Claims, 2 Drawing Sheets

CMOS OUTPUT DRIVER

The invention relates to a CMOS output driver for driving a capacitive load over a circuit trace in high speed applications.

BACKGROUND

There are many applications where an output driver needs to drive a high capacitive load over a trace of a printed circuit board (PCB) with no resistive termination. In such a condition, signal reflection occurs and raises signal integrity issues. Because of power dissipation constraints, it is not practicable to solve the problem with a matched termination resistor.

A possible approach to improve signal integrity in such an environment would be to insert a series damping resistor at the output buffer. This approach is successful in that it improves signal integrity, but it increases signal rise and fall times because of the RC time constant. The RC time constant is given by the product of the value of the series resistor plus the output buffer impedance, on the one hand, and the sum of the capacitive load plus the distributed trace capacitance, on the other hand. The RC time constant reduces the maximum frequency of the system in which the output buffer is used.

SUMMARY

The invention provides a CMOS output driver for driving a capacitive load over a circuit trace, that prevents a loss of signal integrity without sacrificing system speed.

In a described embodiment, the CMOS driver comprises a signal input, a signal output and a pair of buffer amplifiers. The first buffer amplifier has an input connected to the signal input and an output connected to the signal output through a damping resistor. The second buffer amplifier has an input connected to the signal input and an output connected to the signal output through a serial capacitor. Due to the low output impedance of the second buffer amplifier with its serial output capacitor connected in parallel with the first buffer amplifier that has the series resistor, at the moment of sudden polarity change, i.e., the moment of "switching", the overall output impedance of the driver is reduced, thereby "hiding" the presence of the damping resistor. But this reduction of the overall output impedance occurs only momentarily because it is limited to the short switching time. Only a few 100 ps after switching (when the series capacitor is substantially charged) the output impedance of the second buffer amplifier will be high, and the resulting overall output impedance of the driver will be primarily determined by the value of the damping resistor. The result is an improved signal integrity without a significant loss of speed.

In a preferred embodiment, the resistance value of the damping resistor matches the impedance of the circuit trace and the capacitance of the capacitor matches the capacity of the capacitive load. Therefore, any overshoot/undershoot of the output signal with respect to supply and ground voltages are avoided, rendering the proposed driver suitable for low noise applications.

In a preferred CMOS implementation, each buffer amplifier has an output stage with a pair of complementary MOS transistors connected in series between the supply rails. Each of the MOS transistors has its gate connected to the signal input through an inverter. Accordingly, standard circuit designs can be used that are easily implemented in CMOS technology.

BRIEF DESCRIPTION OF THE DRAWINGS

Further advantages and characteristics of the invention will be apparent from the description below of an example preferred embodiment, and from the accompanying drawings, in which.

DETAILED DESCRIPTION

Figure 1:
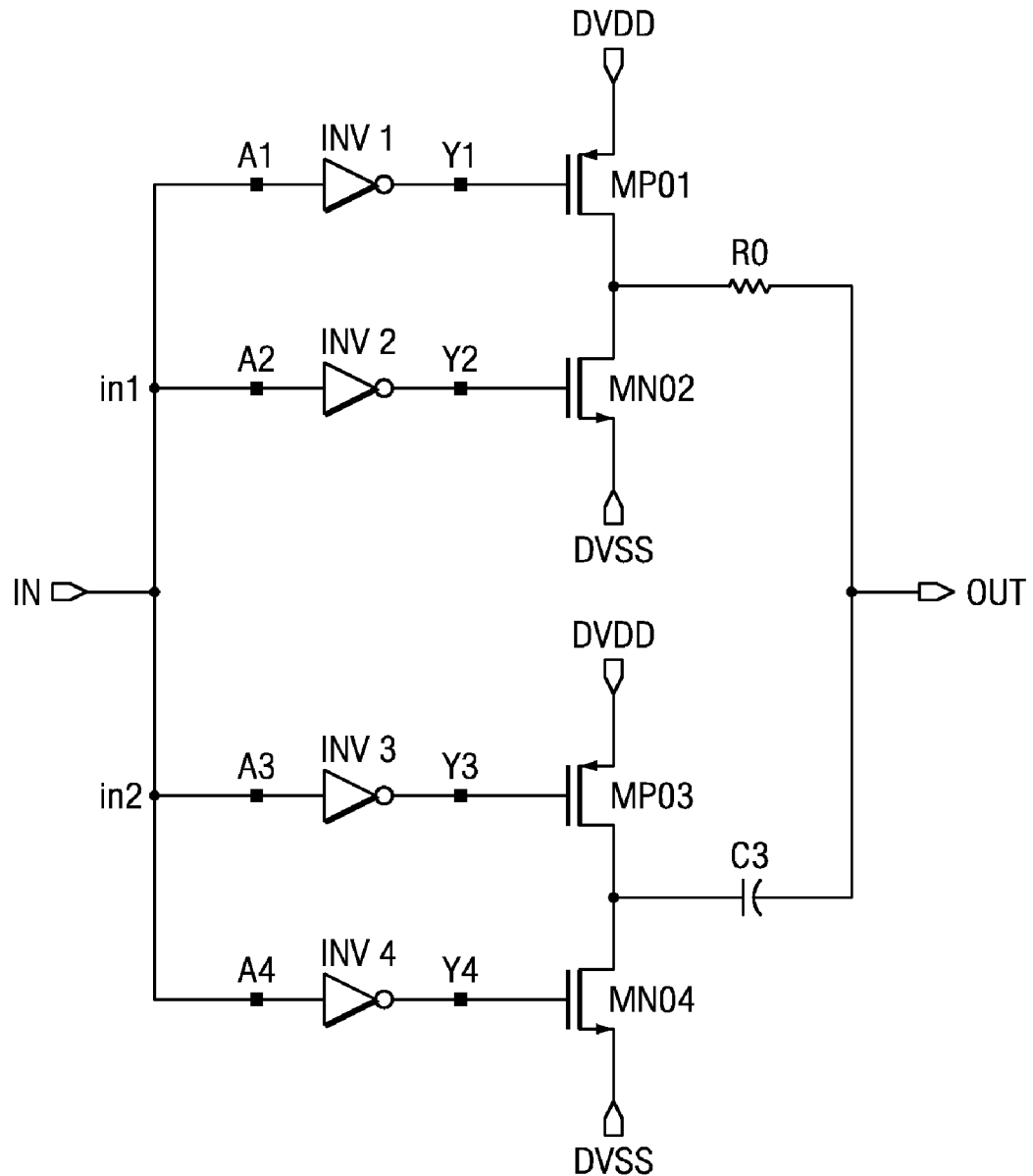
FIG. 1 is a circuit diagram of a CMOS output driver in accordance with the principles of the invention.

Referring now to FIG. 1, a CMOS output driver has an input terminal IN, which is operable to receive an input voltage signal. The input IN is connected to the input in1 of a first buffer amplifier and to the input in2 of a second buffer amplifier, such that the first buffer amplifier and the second buffer amplifier are connected in parallel. Each buffer amplifier has a pair of inverters INV 1, INV 2 and INV 3, INV 4, respectively. The pair of inverters in each of the first and second buffer amplifiers are connected in parallel. Each buffer amplifier also comprises two transistors; an n-type MOS transistor and a p-type MOS transistor, which together form a complementary CMOS pair.

In the first buffer amplifier, the input in1 is connected to the pair of inverters INV 1 and INV 2. The input in1 is connected to the input terminal A1 of inverter INV 1 and to the input terminal A2 of the inverter INV 2. The output Y1 of the inverter INV 1 is connected to the gate of an p-type MOS transistor MP01 and the output Y2 of the inverter INV 2 is connected to the gate of an n-type MOS transistor MN02. The drains of the p-type MOS transistor MP01 and the n-type MOS transistor MN02 are both connected to one terminal of a resistor R0. The other terminal of the resistor R0 is connected to an output terminal OUT of the CMOS output driver. The output terminal OUT is operable to output a signal from the output driver. The sources of the transistors MP01 and MP02 are connected to voltage supply rails DVDD and DVSS, respectively.

In the second buffer amplifier, the input in2 is connected to the input terminal A3 of the inverter INV 3 and also to the input terminal A4 of the inverter INV 4. The output Y3 of the inverter INV 1 is connected to the gate of a p-type MOS transistor MP03 and the output Y4 of the inverter INV 4 is connected to the gate of an n-type MOS transistor MN04. The drains of the p-type MOS transistor MP03 and the n-type MOS transistor MN04 are both connected to one terminal of a capacitor C3. As in the first buffer amplifier, the sources of the transistors MP03 and MP04 are connected to the voltage supply rails DVDD and DVSS, respectively. The other terminal of the capacitor C3, not connected to the drains of the transistors MP03 and MN04, is connected to the output terminal OUT of the CMOS output driver.

Thus, the first buffer amplifier is connected in series with a resistor R0 and the second buffer amplifier is connected in series with a capacitor C3, with the outputs of both buffer amplifier stages being connected in parallel to the output terminal OUT of the output driver, such that the output signal from the terminal OUT is a combination of the output signals from the first buffer amplifier and the second buffer amplifier. The output terminal OUT of the output driver is connected to a load that has a capacitive component and no termination resistor. The load is driven by the signal output from the output driver over a PCB circuit trace. In this particular example, the impedance of the load formed by the PCB trace is about 50 Ohms and the capacitive load is about 30 pF. The output impedance of the first output buffer is given by the product of the on resistance $R_{on}$ of the transistors MP01 and MN02, plus the resistance of the series resistor R0. The first output buffer should be configured such that its output impedance matches the PCB trace impedance as closely as possible; i.e., the output impedance of the first output buffer should be about 50 Ohms. Furthermore, the capacitance of the capacitor C3 in the second buffer amplifier should be the same as that of the capacitive load of the PCB trace; i.e. 30 pF.

Figure 2:
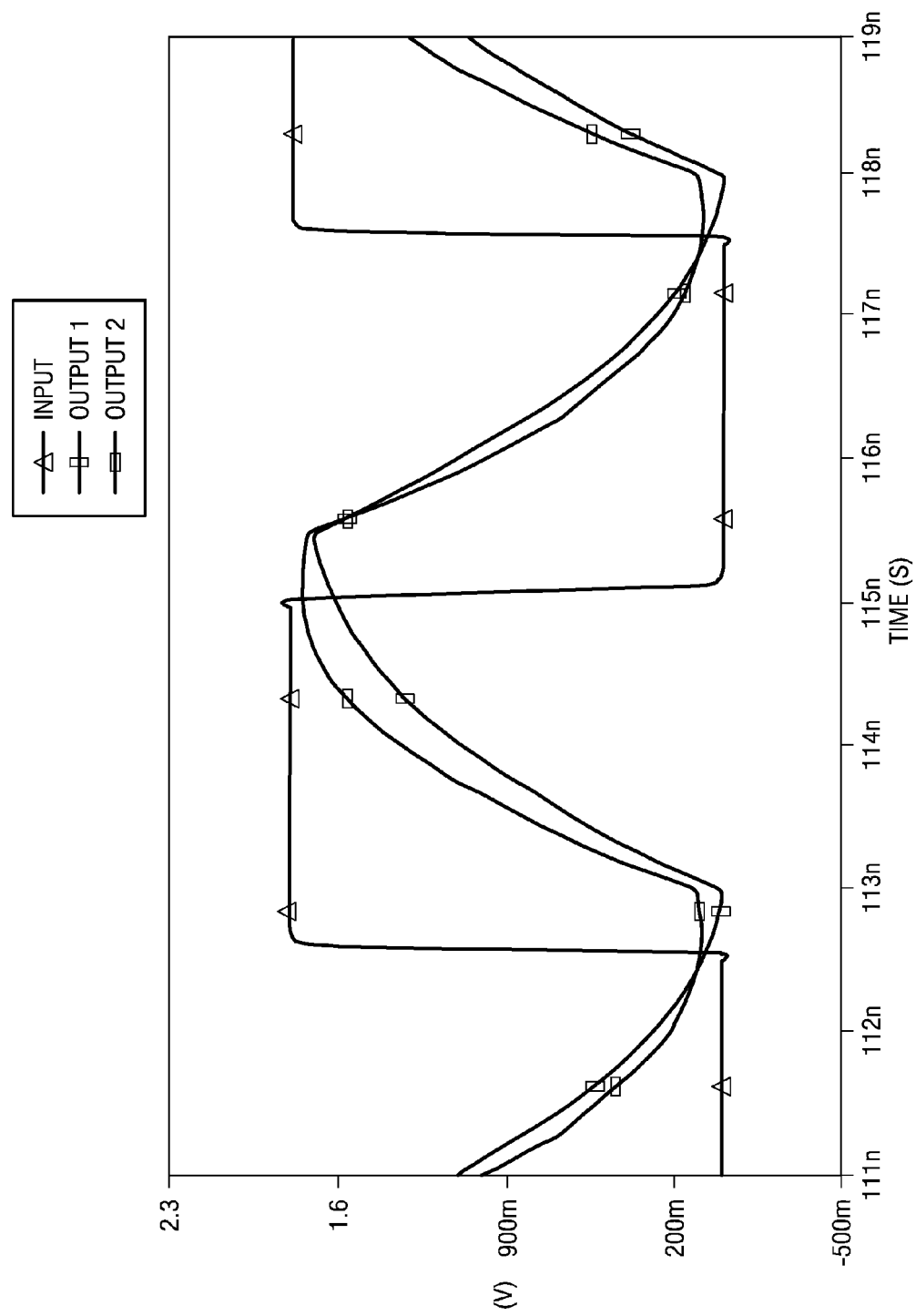
FIG. 2 is a graph comparing the outputs of the two output buffers in the CMOS output driver of FIG. 1.

FIG. 2 compares the output from the first buffer amplifier taken alone (R-output driver Output 1) with the output from the combined buffer amplifiers (RC-output driver Output 2). It can be seen that the series resistor R0 in the first buffer amplifier acts as a damping resistor. Due to the capacitive load at the output, the signal Output 1 has a significant slew. This is compensated for, to a significant extent, by the second buffer amplifier with its series capacitor C3.

The series capacitor C3 provided in the second buffer amplifier adds to the overall output a signal component that improves the waveform of the output signal. Therefore, since the two signals from the first and second buffer amplifiers are combined at the output OUT of the driver, the second buffer amplifier connected in series with the capacitor C3 reduces the detrimental effect of the RC time constant from the first buffer amplifier. The resultant output signal OUT at the output terminal of the driver is significantly accelerated and has a much faster rise time than a buffer amplifier with a series damping resistor used alone. However, since the series capacitor has a low value, the low output impedance of the second buffer amplifier is effective only during the switching phase of the signal, so that the damping effect by the damping resistor is not affected.

Since the RC time constant from the damping mechanism of the series resistor R0 in the first buffer amplifier can be reduced and the resultant output signal has a faster transition time, this CMOS output driver provides the advantage that higher values of frequency can be used for the maximum system frequency. Furthermore, the output driver can be implemented in CMOS technology and provides high speed with decreased power consumption and also reduced noise generation in the PCB circuit trace.

Although, in the above-described embodiment, the impedance of the first buffer amplifier matches the impedance of the PCB trace and the capacitance of the capacitor C3 in the second buffer amplifier matches the capacitive load of the PCB trace, this is not essential. However, matching the impedances and capacitances is advantageous in reducing noise associated with the output signal overshooting the supply voltage or undershooting the ground voltage.

Those skilled in the art to which the invention relates will appreciate that the described embodiment is presented merely be way of representative example, and that there are other embodiments and variations of embodiments for implementing the claimed invention.

What is claimed is:

1. A CMOS output driver for driving a capacitive load over a circuit trace in high speed applications, comprising:
    a signal input;
    a signal output;
    a first buffer amplifier with an input connected to the signal input, wherein the first buffer includes:
        a first pair of complementary MOS transistors connected in series between power supply terminals; and
        a first pair of inverters, wherein each inverter is connected between the signal input and a gate of one of MOS transistors from the first pair;
        a resistor that is connected between an output of the first buffer and the signal output; and
    a second buffer amplifier with an input connected to the signal input, wherein the second buffer includes:
        a second pair of complementary MOS transistors connected in series between the power supply terminals; and
        a first inverter connected between the signal input and a gate of each MOS transistor of the second pair; and
    a capacitor that is connected between an output of the second buffer and the signal output, wherein the second buffer amplifier and the capacitor are generally in parallel to the first buffer amplifier and the resistor.

2. The CMOS output driver of claim 1, wherein, for the first buffer amplifier, the resistor is connected between drains of its respective complementary pair of MOS transistors and the signal output; and, for the second buffer amplifier, the capacitor is connected between drains of its respective complementary pair of MOS transistors and the signal output.

3. The CMOS output driver of claim 1, wherein the resistance value of the resistor matches the impedance of the circuit trace; and the capacitance of the capacitor matches the capacitance of the capacitive load.

4. The CMOS output driver of claim 1, wherein, for the first buffer amplifier, the resistor is connected between drains of its respective complementary pair of MOS transistors and the signal output; and, for the second buffer amplifier, the capacitor is connected between drains of its respective complementary pair of MOS transistors and the signal output.

5. An apparatus for driving a capacitive load over a circuit trace in high speed applications, the apparatus comprising:
    an input terminal;
    an output terminal;
    a first power supply terminal;
    a second power supply terminal;
    a first buffer amplifier including:
        a first inverter that is connected to the input terminal;
        a second inverter that is connected to the input terminal;
        a first PMOS transistor that is connected to the first power supply terminal at its source and that is connected to the first inverter at its gate;
        a first NMOS transistor that is connect to the second power supply terminal at its source and that is connected to the second inverter at its gate; and
        a resistor that is connected between the drains of the first PMOS transistor and the first NMOS transistor and the output terminal;
    a second buffer amplifier including:
        a third inverter that is connected to the input terminal;
        a fourth inverter that is connected to the input terminal;
        a second PMOS transistor that is connected to the first power supply terminal at its source and that is connected to the third inverter at its gate;
        a second NMOS transistor that is connect to the second power supply terminal at its source and that is connected to the fourth inverter at its gate; and
        a capacitor that is connected between the drains of the second PMOS transistor and the second NMOS transistor and the output terminal.

6. The apparatus of claim 5, wherein the resistance value of the resistor matches the impedance of the circuit trace; and the capacitance of the capacitor matches the capacitance of the capacitive load.

* * * * *